United States Patent [19]
Braden

[11] 3,948,298
[45] Apr. 6, 1976

[54] AUTOMATIC LEAD STRAIGHTENING OF AXIAL LEADED COMPONENTS

[75] Inventor: Denver Braden, San Diego, Calif.

[73] Assignee: Illinois Tool Works Inc., Chicago, Ill.

[22] Filed: Mar. 26, 1975

[21] Appl. No.: 562,320

[52] U.S. Cl. ................................ 140/147; 140/149
[51] Int. Cl.² .......................................... B21F 1/02
[58] Field of Search ............. 140/1, 71.5, 140, 147, 140/149; 81/9.51

[56] References Cited
UNITED STATES PATENTS

| | | | |
|---|---|---|---|
| 1,592,592 | 7/1926 | Anderson et al. | 81/9.51 |
| 2,783,525 | 3/1957 | Scharf | 140/149 |
| 3,349,813 | 10/1967 | Pastuszak | 140/147 |
| 3,701,233 | 10/1972 | Luckman | 140/147 |

Primary Examiner—Lowell A. Larson
Attorney, Agent, or Firm—Glenn W. Bowen; Robert W. Beart

[57] ABSTRACT

Axial leads extending from opposite ends of electronic components are strightened by two pairs of fingers having pads which press on the leads and are rotated in opposite directions while they are driven along the leads. The straightening fingers have pads on their ends which are made of a soft resilient material, such as nylon. The fingers each have a cam follower on their ends away from the pads which allows the fingers to be opened and closed by the longitudinal motion of a cam on the end of a rod that is slideably positioned in a rotating tube. One end of the tube is attached to a support member and the fingers are secured to the support member. The finger pads are preferably shaped so that they overbend the lead by a small amount, such as 5°.

3 Claims, 8 Drawing Figures

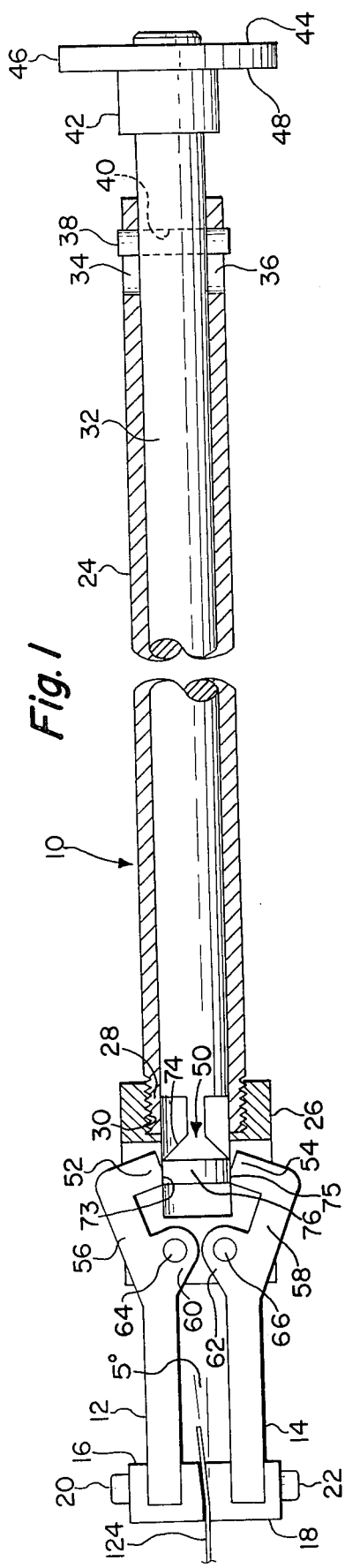
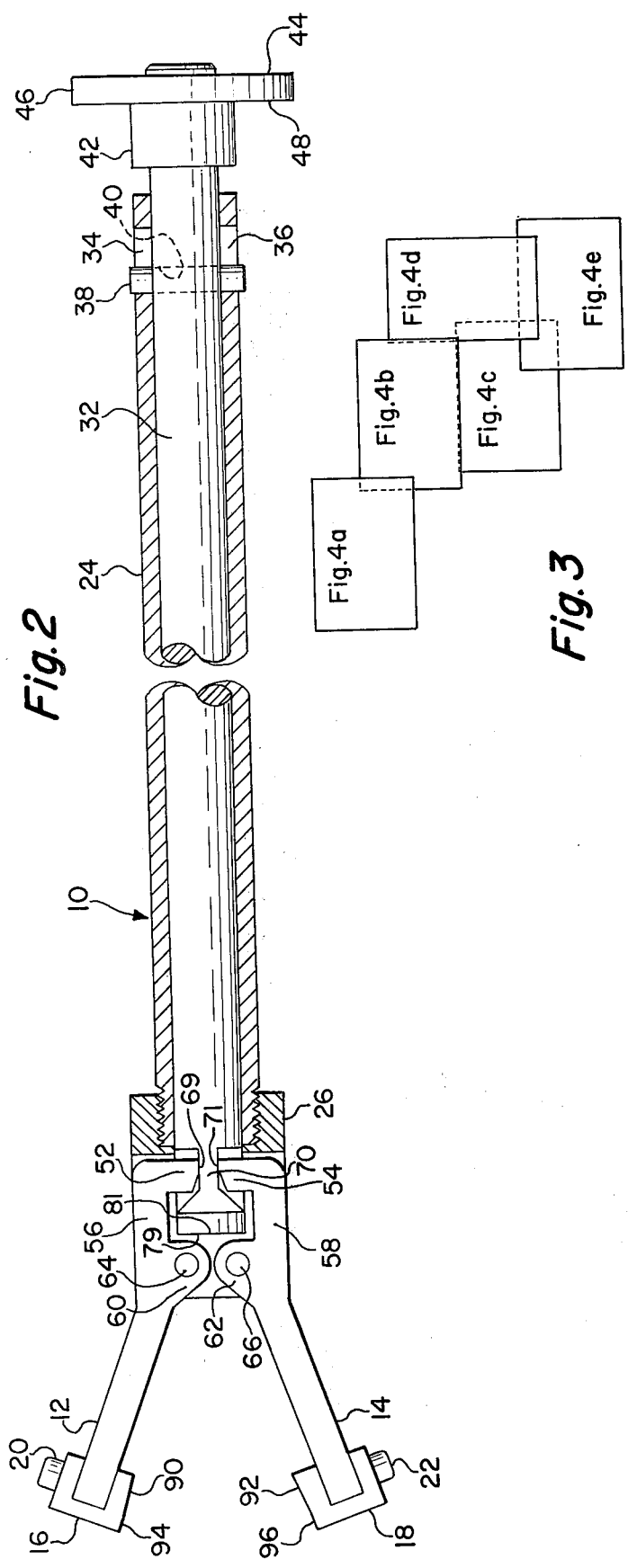

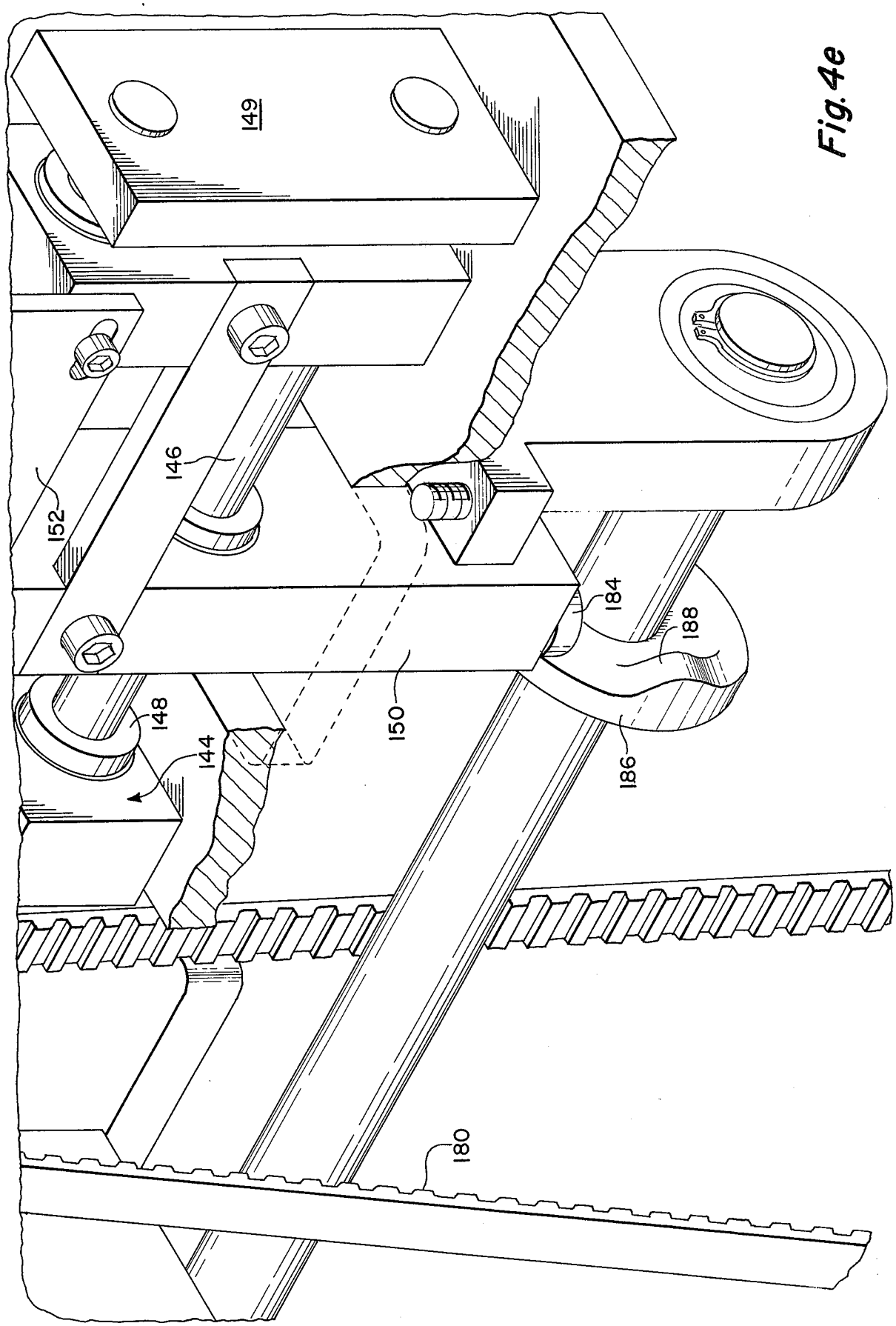

AUTOMATIC LEAD STRAIGHTENING OF AXIAL LEADED COMPONENTS

BACKGROUND OF THE INVENTION

Prior lead straighteners which have a pair of jaws that are opened and closed as a piston drove the straightening mechansim back and forth along the lead have proposed. An example of this type of straightener is shown in Smith et al. U.S. Pat. No. 3,220,443. Operation of the straightening mechanism of the present invention has demonstrated that improved lead straightening may be achieved with a relatively simple mechanism contructed in accordance with the present invention in which straightening pads that contact the leads are rotated as they are withdrawn from the body of the component.

DESCRIPTION OF THE DRAWINGS

The present invention is described by reference to the drawings in which:

FIG. 1 is a cross-sectional view which shows the lead straightening mechanisn of the straighening machine of the described embodiment with the fingers in a closed position;

FIG. 2 is a cross-sectional view that shows the lead straightening mechanism of FIG. 1 with the straightening finers in an open position;

FIG. 3 is a diagrammatic plan that shows how the drawing sheets containing FIGS. 4a – 4e must be placed in order to show a perspective view of the straightening machine of the described embodiment; and FIG. 4a – 4e show a perspective of the straightening machine of the described embodiment of the invention when these figures are arranged in accordance with the diagrammatic plan of FIG. 3.

TECHNICAL DESCRIPTION OF THE INVENTION

Figure 4A:
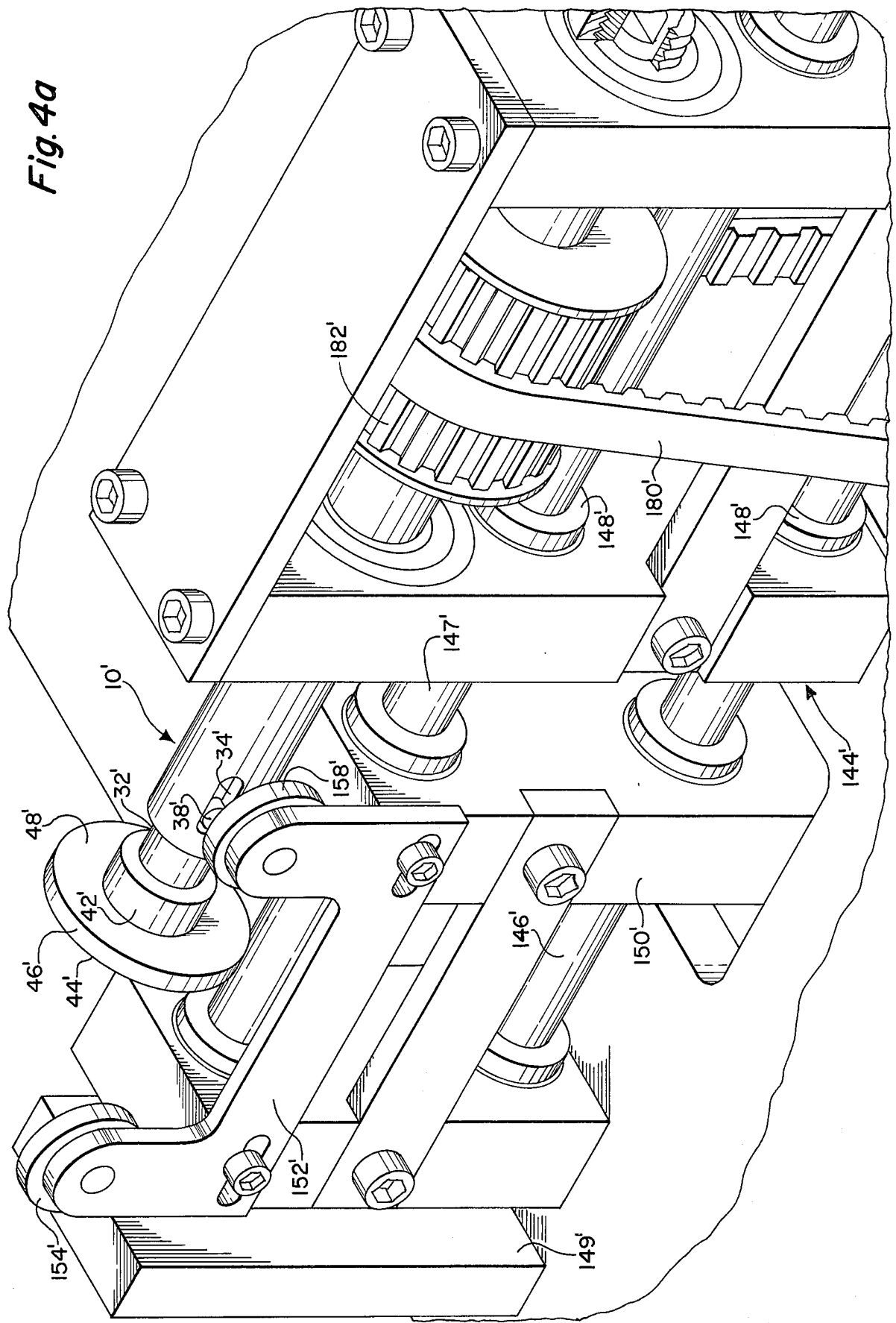

The present invention involves a pair of straightening mechanisms each of which have a pair of fingers for straightening one of the leads of an axial leaded component, such as an electrical capacitor, which have finger pads on their ends that are made of a soft resilient material, such as nylon. The pads are closed upon the leads and press against them while the fingers and the pads are continually rotated and are simultaneously drawn along the lead. After a lead has been straightened, the fingers open up while still rotating so that a new component may be inserted into the straightening position of the mechanism. The general operation of the straightening mechanism of the described embodiment may be shown by reference to FIGS. 1 and 2.

FIG. 1 shows a straightening mechanism 10 for straightening one lead of a component. The straightening mechanism 10 consists of a pair of fingers 12, 14 on diametrically opposite sides of the periphery of the lead to be straightened which may be driven to either the closed position shown in FIG. 1, or the open position shown in FIG. 2. The finger pads 16, 18 are secured on the free end of the fingers 12, 14 in order to prevent damage to the soft plating that is often provided on the leads of electrical components. The bolts 20, 22 secure the finger pads 16, 18 in place on the free ends of the fingers 12, 14 respectively.

The entire lead straightening mechanism 10 is constantly rotated whether the fingers 12, 14 are opened or closed. When the fingers 12, 14 of the described embodiment are closed on a lead the entire straightening mechanism 10 is drawn away from the body of the component to straighten the lead. The straightening mechanism 10 is returned towards the body of the next component after the fingers 12, 14 have been opened and the previous component, with its straightened leads, has been deposited in a storage bin, in accordance with the operation of machine elements that are subsequently described in detail. Rotation of the mechanism 10 is achieved by means of a drive system, which is described in conjunction with FIGS. 4a – 4e that serves to rotate the tube 24 and the fingers 12, 14 since they are secured to the support member 26 that has internal threads 28 which receive the threaded forward end 30 of the tube 24.

The mechanism for opening and closing the fingers 12, 14 includes a rod 32, which is slideable in a longitudinal direction within the tube 24. The end of the tube 24, away from the support member 26, has a pair of slots 34, 36 in it. These slots receive a pin 38 that is driven through an aperture 40 in the rod 32 in order to allow the rod 32 to slide to a limited extent with respect to the tube 24, and also to insure that the rod 32 rotates with the tube 24. The end of the rod 32 away from the block 30 has a control flange 42 attached to it. Application of force on the right-hand surface 44 of the disc-shaped portion 46 of the flange 42 serves to push the rod 32 towards the left, as shown in FIG. 2 wherein the fingers 12, 14 are opened; while application of force on the left-hand surface 48 of the disc-shaped portion 46 of the flange 42 serves to push the rod to the right, as shown in FIG. 1, wherein the fingers 12, 14 are closed. A cam, or other means, is employed to apply a positive pressure of the surface 48 when the fingers are closed and mechanism 10 is bein driven away from the body of the component.

The opening and closing of the fingers 12, 14 is controlled by a cam 50 that is partially enclosed by the support member 26 and a pair of cam follower legs 52, 54 on the generally C-shaped sections 56, 58 of the fingers 12, 14. The hubs 60, 62 of the C-shaped sections 56, 58 have apertures in them to receive the pins 64, 66. The pins 64, 66 are secured to the support member 26 and the fingers 12, 14 pivot around the pins 64, 66 while changing from their open to their closed position. When the fingers 12, 14 are opened, centrifugal force on the free ends of the fingers 12, 14 due to rotation of the mechanism 10, forces the ends of the legs 52, 54 towards each other so that their surfaces 69, 71 are brought into contact with the elongated segment 70 of the cam 50. When the fingers 12, 14 are in the closed position, the forward surface 79 of the cylindrical portion 76 of the cam 50 is abutted against the wall 81 of the support member 26. When the flange 42 is forced to the right, by application of a force to the surface 48, the cam follower surfaces 73, 75 on the fingers 12, 14, respectively, which slope away from the corresponding surfaces 69, 71 on the fingers 12, 14, ride up the ramp portion 74 of the cam 50 to the large cylindrical portion 76, at which point the finger pads 16, 18 are brought substantially close to each other so as to press against the lead of the component which is to be straightened. The rear half of the finger pad 16 has an upwardly sloped surface 90 and the rear half of the finger pad 18 has a conforming sloping surface 92 to achieve a slight overbending of the leads. The angle of the surfaces 90, 92, with respect to the parallel flat surfaces 94, 96 on the forward end of the pads 16, 18, is approximately 5°, as shown in FIG. 1.

In operation, the components having leads to be straightened are positioned at a straightening station when the fingers 12, 14 are opened and the flange 42 is positioned to the left, as shown in FIG. 2. The flange 42 is then forced to the right and the fingers 12, 14 are closed so that the pads 16, 18 press against a lead and straightening of the lead is then accomplished by drawing the pads 16, 18 from the body of the component while they are being continually rotated.

The drawings of FIGS. 4a – 4e show an overall perspective view of an embodiment of the present invention which utilizes the straightening mechanism 10 of FIGS. 1 and 2. An overall perspective view is obtained by arranging the figures as shown in FIG. 3. In this arrangement, the upper left-hand corner of FIG. 4b overlaps with the lower right-hand corner of FIG. 4a; the upper edge of FIG. 4c overlaps the lower edge of FIG. 4b; the left-hand edge of FIG. 4d overlaps the right-hand edges of both FIGS. 4b and 4c and the upper and left-hand edges of FIG. 4e overlaps the lower edge of FIG. 4d and the lower right-hand portion of FIG. 4c.

In order to obtain a constant and a uniform feeding of electrical components 100 by the lead straightening machine 102, which incorporates a pair of lead straightening mechanisms 10, it is desirable to use a magnetic feed bin apparatus of the type disclosed in the Beroset et al., U.S. Pat. Nos. 3,388,375 and 3,537,580. The feeding apparatus of the Beroset et al. patents consists of a magnetic bin which suspends axial lead electrical components in a magnetic field. The feed bin is constructed with magnetic members in the side walls which are positioned and shaped so that the magnetic flux density in the bin increases as the output end of the bin is approached, so as to move the components toward the output end of the bin. A rotating pick-up wheel is positioned at the output end of the feed bin which sequentially receives the leads of the components in pairs of notches formed in the periphery of the pick-up wheel. The pick-up wheel is constructed of nonmagnetic material and has a magnetic embedded in it in the vicinity of each of the notches so as to guide the components into position in the notches as the pick-up wheel is indexed in steps past the output end of the bin.

After the leads have been straightened, they may be fed to a magnetic storage bin 106 which is similar in construction to the feed bin 104. The magnetic bins 104, 106 both have a pair of side walls 112, which may be formed from standard low-carbon steel. The side walls enclose elongated magnets 113 which are positioned so that they converge from one end toward the other. The side walls are held together by means of locking bolts 117. The position and the shape of the magnets is designed so that an increasing magnetic flux field is produced toward the output end of the bin so that when axial lead components are placed in the bin they are suspended between the walls 112, and they tend to move forward towards the output end of the bin under the influence of the magnetic field. Positioned at the output end of the bin is a nonmagnetic pick-up feed wheel 118 which has a plurality of pairs of notches 126 in its outer periphery. The pick-up wheel 118 is secured around the shaft 119 by means of the key 121 which fits into the keyslot 123 in the shaft 119 and the keyslot 125 in the hub 127 of the wheel 118. The shaft 119 is driven by the gear 129 which is coupled to the drive gear 131 that is secured on the shaft 133 that supports the geneva mechanism 130 and is driven by conventional drive mechanism that is not shown. Behind each of the notches 126 a permanent magnet 122 is embedded into the interior of the wheel 118. The embedded magnets have a sufficient strength so that they will attract the leads 123, 124 that extend from the body 105 of the axial leaded components 100 from the output end of the feed bin 104 into the notches 126. Each of the components 100 is thus sequentially fed onto the pick-up wheel 118 from the bin 104 as the pick-up wheel 118 rotates.

Figure 4B:
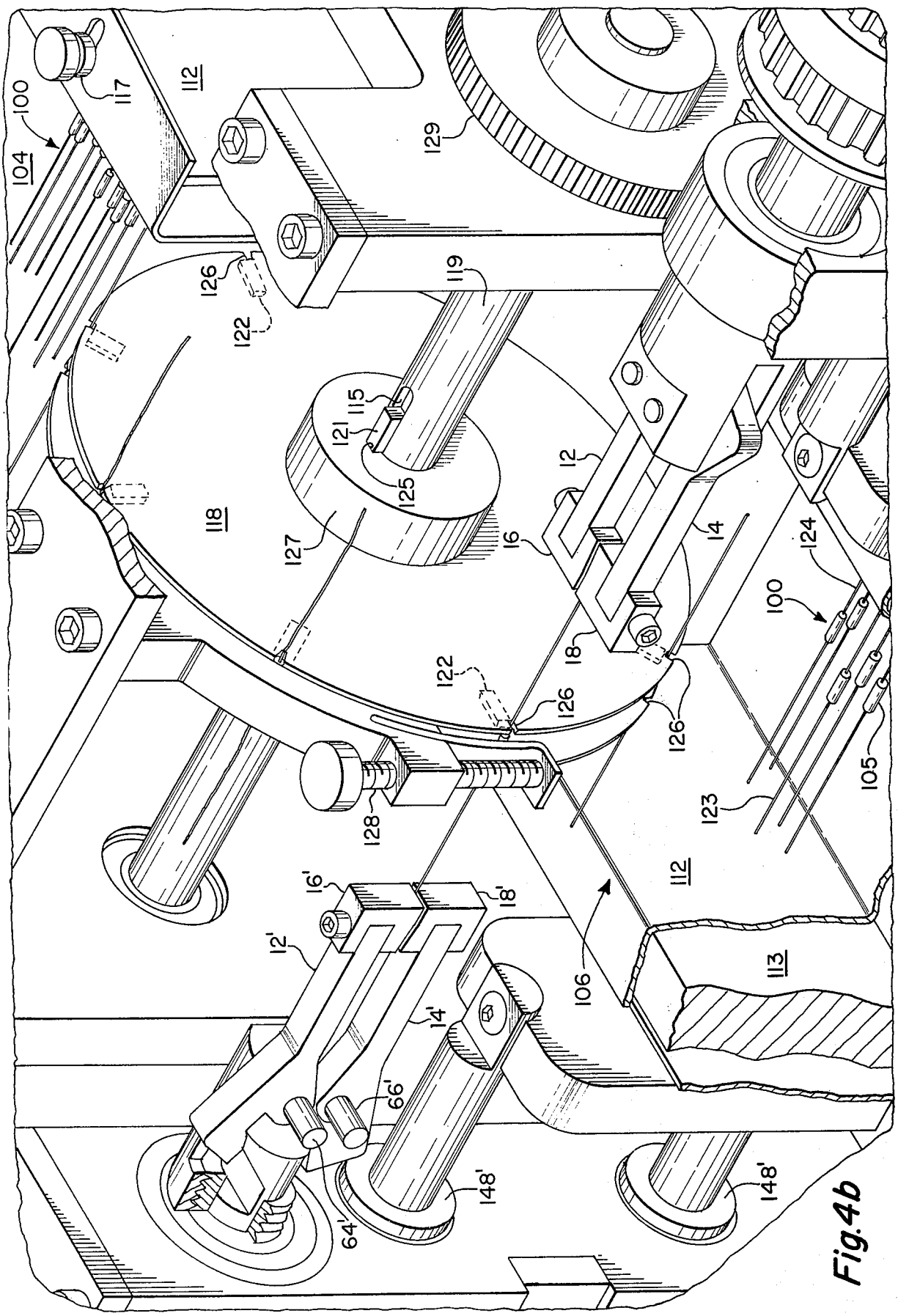
Figure 4C:
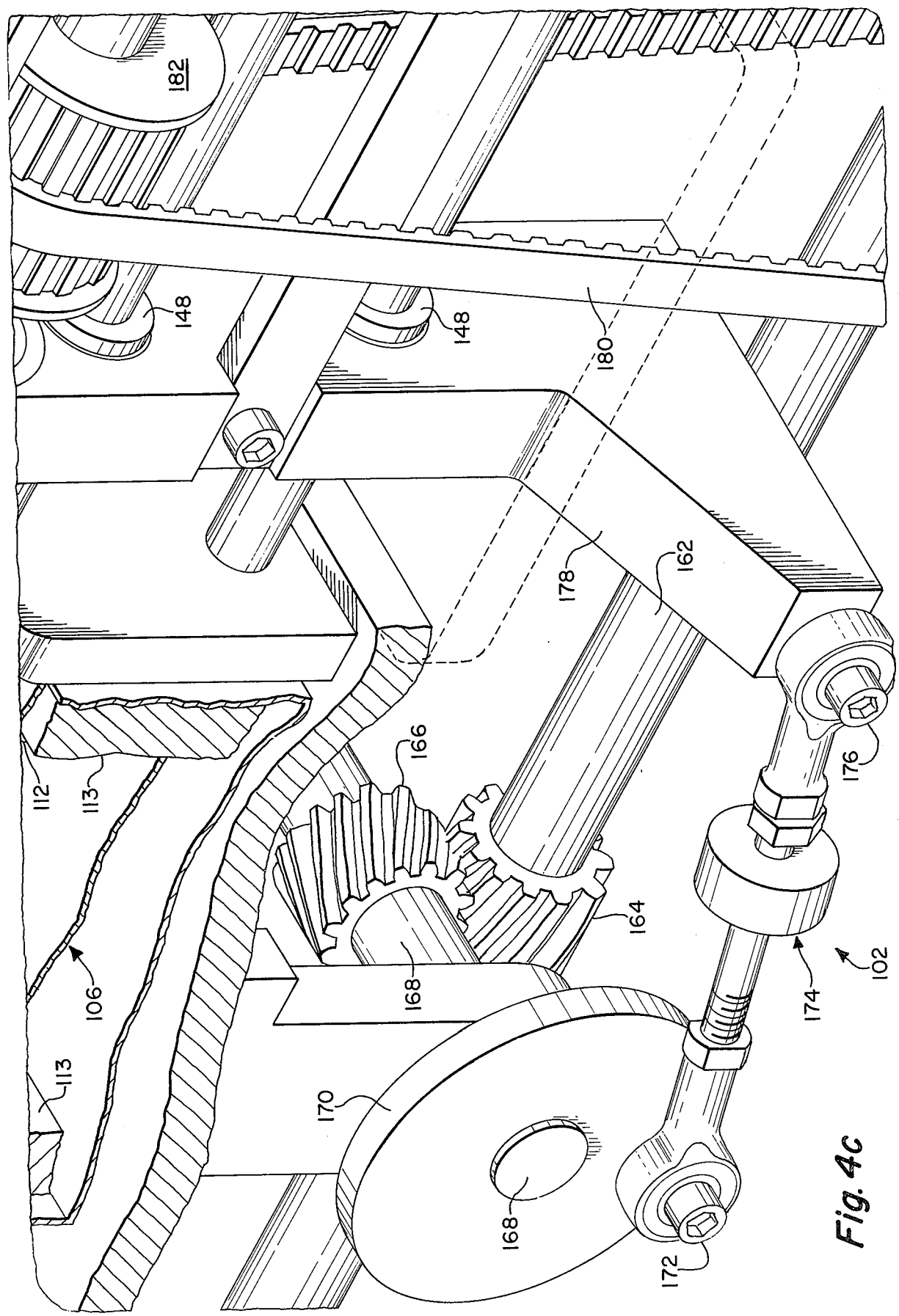
Figure 4D:
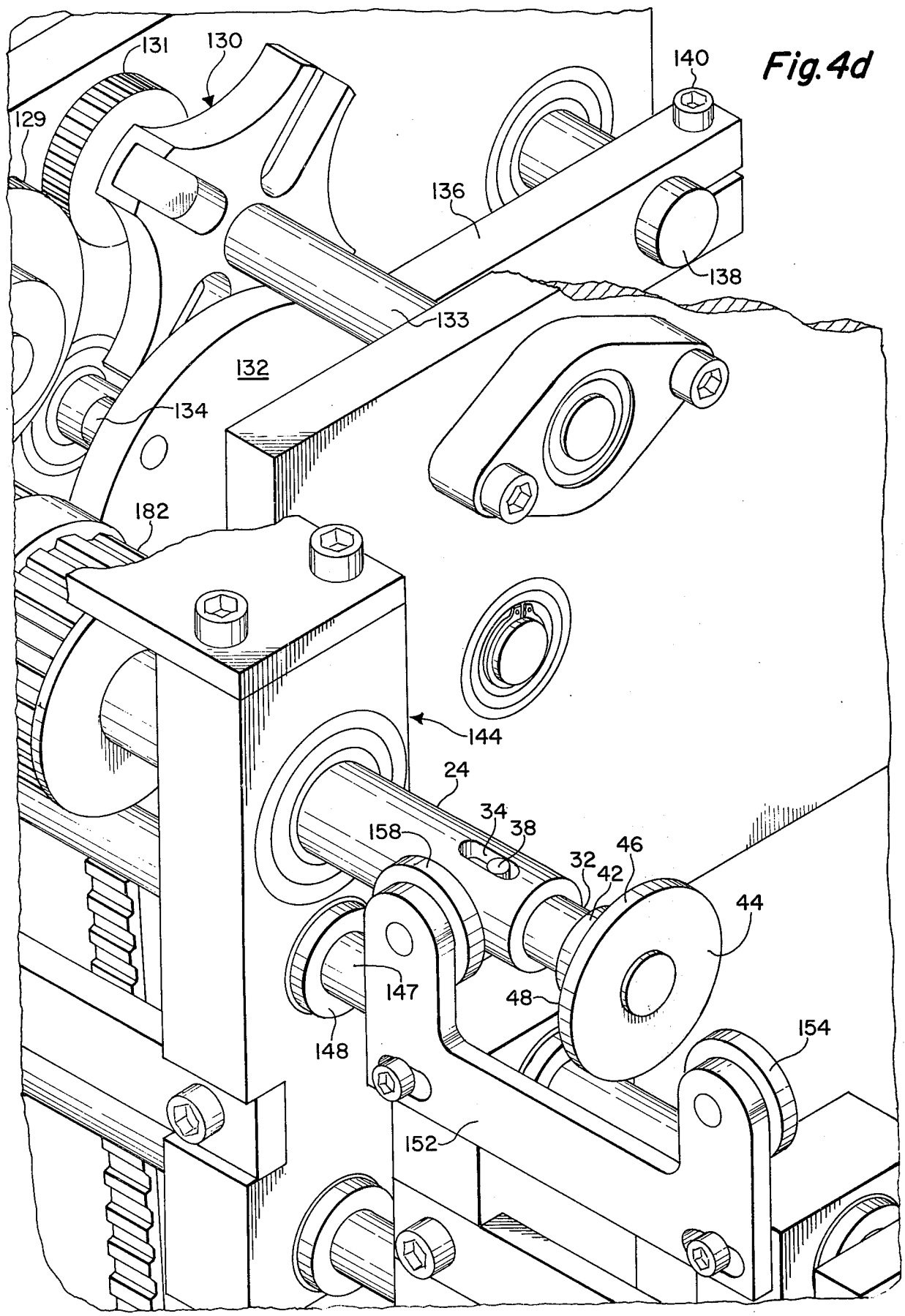

The components 100 on the pick-up wheel 118 are then brought to the straightening station position shown in FIG. 4b where the finger pads 16, 18 press on the leads 124 while the finger pads 16', 18' press on the lead 123. The fingers 12, 14 and the finers 12', 14' rotate continuously in opposite direction with each side of the machine, each being powered with a separate motor (not shown). By rotating the fingers 12, 14 and 12', 14' in opposite direction, torque on the leads 123, 124 and on the body 105 of the components 100 is thereby minimized. The adjustable part retainer 128 helps to retain the component in place at the straightening station. After the leads of a component have been straightened, the pick-up wheel is indexed through several stages and a nonferrous fork (not shown) strips the components 100 from the pick-up wheel 118, allowing them to drop into the storage bin 106.

In order to prevent bunching of the components 100 in the feed bin 104, it is desirable to use a mechanism which rocks the input end of the mechanism in a periodic fashion. The arm 136, which is secured to the shaft 138 by means of the bolt 140, achieves this by turning the shaft 138, which has a flat on it (not shown), in order to periodically jog the input end of the feed bin 104. The precise manner in which this is achieved is described in detail in U.S. Pat. application Ser. No. 531,935 filed Dec. 12, 1974, in the name of Denver Braden and assigned to the assignee of the present invention. While the present invention is shown in combination with a magnetic feed bin which is constructed generally in accordance with the previously mentioned Beroset et al. patents, it is to be noted that the present invention may be utilized in conjunction with other types of known feeding apparatus and it is not limited to use with the particular magnetic feeding apparatus disclosed herein.

The right-hand lead straightening mechanism 10 is indicated by unprimed numbers; while the left-hand lead straightening mechanism 10' is indicated by primed numbers, as previously indicated; otherwise the construction of both of the mechanisms 10, 10' is identical. The mechanism 10, 10' are secured to moveable carriages 144, 144', respectively, which slide back and forth on their respective shafts 146, 147, 146', 147' on suitable slide bearings. At the other ends of the lead straightening machine 102, there are the brackets 152, 152' on the frame members 150, 150' which support opening rollers 154, 154' and closing rollers 158, 158' positioned so that the flanges 42, 42' are located intermediate the rollers 154, 158 or 154', 158', respectively.

The drive for the machine comprises a drive system which includes a shaft 162 which carries a gear 164 on it which engages the gear 166 on the shaft 168 which is disposed substantially normal to the shaft 162. A drive disc 170, which has an eccentrically mounted pin 172 on it, is supported on the shaft 168 and is secured to the adjustable turnbuckle 174 to form a bell crank mechanism. The turnbuckle 174 allows for adjustment of the forward stroke of the straightening mechanism 10 to conform to the length of the body of the component. The other end of the turnbuckle 174 is secured to the pin 176 which extends from the frame member 178. Thus, as the shaft 162 revolves, the gear 164 on the shaft 162 drives the gear 166 which causes the shaft 168 and the disc 170 to revolve. Revolution of the disc 170 causes the turnbuckle 174 to oscillate back and forth. The end of the turnbuckle 174 remote from the pin 172 is secured to a pin 176 that is on the frame member 178 of the slideable carriage 144. The carriage 144 thus reciprocates back and forth along the shaft 146 in a periodic fashion.

When the surface 44 of the flange 42 comes into contact with the opening roller 154 due to movement of the carriage 144 and the mechanism 10 to the fingers the finers 12, 14 are opened, as shown in FIG. 2, as the carriage travels to the right beyond the contact point. The rod 32 then slides forward toward the component relative to the tube 24. The component that has had it leads straightened is indexed to a stripping location and is then stripped from the pick-up wheel 118 and a new component is indexed into place at the straightening station. The carriage 144 then reverses its direction as the turnbuckle 174 pulls it toward the body 105 of the component 100. The carriage 144', which functions in a similar manner, simultaneously reverses its direction so that both of the straightening mechanisms 10, 10' move towards the body 105 of the component 100 at the same time. The carriage 144' for the mechanism 10' may be driven in unison with the carriage 144 by means of a second turnbuckle and coupling mechanism )now shown), which is coupled to engage a disc similar to the disc 170 which is located on the other end of the shaft 168 (not shown).

When the surfaces 48, 48', respectively, come into contact with the closing rollers 158, 158', the fingers 12, 14 and 12', 14' are closed to engage the leads 124, 123, respectively, while the carriages 144, 144' continue their overtravel toward the body of the component. The straightening mechanisms 10, 10' are each rotated in an opposite sense so that one undergoes clockwise rotation while the other undergoes counterclockwise rotation. The necessary drive for this is achieved by means of the drive belts, 180, 180', which are driven by drive motors (not shown), engage the drive wheels 182, 182' that are secured to the tubes 24, 24' in order to achieve the desired rotation. Rotation of the tubes 24, 24' is preferably at a rate of approximately 5000 revolutions per minute.

While the fingers, for example, the fingers 12, 14 are closed and the carriage 144 is drawing the pads 16, 18 over the leads away from the body of the component, it is ncessary to insure that the finger pads 16, 18 are positively held in engagement with the periphery of the lead 124. This is achieved by means of a cam follower 184 which is secured at the bottom of the frame member 150. The frame member 150 is mounted for limited slideable back and forth movement on the shafts 146, 147. Movement of the frame member 150 is limited by the stop 149. The cam follower 184 contacts a cam 186 on the drive shaft 162 upon closure of the fingers 12, 14. The cam 186 has a raised portion 188 that insures that a definite amount of pressure will be applied on the lead by the pads 16, 18 for a predetermined portion of the outwardly directed straightening stroke of the carriage 144. A similar cam and cam follower arrangement, of course, operates in conjunction with the carriage 144' which insures positive pressure of the finger pads 16', 18' on the lead 123 during the outwardly directed stroke of the carriage 144'.

The invention is claimed as follows:

1. A straightening mechanism for an elongated cylindrical element having an elongated axis comprising a pair of gripping means for engaging diametricaly opposite sides of the periphery of said element and a cam follower coupled to a second end of each of said gripping means, an elongated hollow tube, a support member secured to a first end of said tube with each of said gripping means being pivotly mounted on said support member intermediate said pad and said cam follower, an elongated rod slideably positioned inside of said tube so as to be capable of reciprocation back and forth along said elongated axis, coupling means constructed to limit the amount of said reciprocation of said rod and to couple together said rod and said tube so that they will rotate in unison, a cam secured to a first end of said rod which engages said cam followers and which is shaped so that when said rod is positioned in a first position said gripping means are pivoted to an open position at which said gripping means are not in engagement with said element and when said rod is positioned in a second position said gripping means are pivoted to a closed position at which said gripping means are in engagement with said element, an operating member having first and second control surfaces secured to the second end of said rod which is remote from said cam, control means constructed to interact with said operating member for controlling the position of said rod and drive means for rotating said tube, said rod, said support member and said gripping means as a unit about said element with simultaneously drawing said unit along said cylindrical element while said gripping means engage said cylindrical element, wherein said drive means comprises a carriage that carries said rod and a carriage reciprocation means for driving said carriage back and forth along said elongated axis in a reciprocating manner and said control means comprises a stationary frame member, an opening member secured to said frame member that engages said first control surface of said operating member to force said rod to said first position at a first time and a closing member secured to said frame member that engages said second control surface of said operating member to force said rod to said second position at a second time as said carriage and said rod reciprocate back and forth.

2. A straightening mechanism as set forth in claim 1 wherein said gripping means comprises a pair of resilient pads that are positioned on diametrically opposite sides of said elongated element and said pads are constructed to overbend said elongated element approximately 5°.

3. A straightening mechanism as set forth in claim 1 wherein said frame member is moveable to a limited extent along said elongated axis and comprises an additonal cam follower and said drive means further comprises an additional cam which interacts with said additional cam follower to insure that said closing member retains said rod in said second position for a predetermined time while said unit is being rotated and drawn along said elongated element.

* * * * *